(12) United States Patent
Kishibata et al.

(10) Patent No.: US 9,761,969 B2
(45) Date of Patent: Sep. 12, 2017

(54) CONNECTOR

(71) Applicant: YAZAKI CORPORATION, Tokyo (JP)

(72) Inventors: Yuya Kishibata, Makinohara (JP); Junya Shinohara, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 15/295,243

(22) Filed: Oct. 17, 2016

(65) Prior Publication Data
US 2017/0033475 A1 Feb. 2, 2017

Related U.S. Application Data

(63) Continuation of application No. PCT/JP2015/062457, filed on Apr. 23, 2015.

(30) Foreign Application Priority Data

Apr. 24, 2014 (JP) .................................. 2014-089982
May 30, 2014 (JP) .................................. 2014-111833

(51) Int. Cl.
*H01R 12/00* (2006.01)
*H01R 12/58* (2011.01)
(Continued)

(52) U.S. Cl.
CPC ............ *H01R 12/58* (2013.01); *H01R 12/707* (2013.01); *H01R 12/724* (2013.01); *H05K 1/18* (2013.01);
(Continued)

(58) Field of Classification Search
CPC ....................................................... H01R 12/58
(Continued)

(56) References Cited

U.S. PATENT DOCUMENTS

| 5,540,598 A | * | 7/1996 | Davis | ................... H01R 12/724 439/79 |
| 5,921,789 A | * | 7/1999 | Makino | ............... H01R 12/716 439/590 |

(Continued)

FOREIGN PATENT DOCUMENTS

| JP | 9293573 A | 11/1997 |
| JP | 2008146880 A | 6/2008 |

(Continued)

OTHER PUBLICATIONS

Written Opinion dated Jun. 30, 2015, by the International Searching Authority in counterpart International Application No. PCT/JP2015/062457 (PCT/ISA/237).

(Continued)

*Primary Examiner* — Abdullah Riyami
*Assistant Examiner* — Nader Alhawamdeh
(74) *Attorney, Agent, or Firm* — Sughrue Mion, PLLC

(57) ABSTRACT

A connector includes a connector housing, a plurality of terminals including foot portions extending to the outside of the connector housing, and a position aligning plate including a plurality of terminal insertion holes, the foot portions of the terminals being configured to be inserted into the terminal insertion holes so that the foot portions align with corresponding through holes of a circuit board. The foot portions of the terminals are configured to be soldered with the circuit board by a reflow system using hot air as a hearing source. A vent hole is provided in the position aligning plate to introduce the hot air to soldering parts through the vent hole.

8 Claims, 6 Drawing Sheets

(51) Int. Cl.
*H05K 1/18* (2006.01)
*H05K 3/34* (2006.01)
*H01R 12/70* (2011.01)
*H01R 12/72* (2011.01)

(52) U.S. Cl.
CPC ............ *H05K 3/34* (2013.01); *H05K 3/3447* (2013.01); *H05K 2201/10189* (2013.01)

(58) Field of Classification Search
USPC ...................................................... 439/83, 79
See application file for complete search history.

(56) References Cited

U.S. PATENT DOCUMENTS

| | | | | |
|---|---|---|---|---|
| 6,012,930 | A * | 1/2000 | Tokuwa | H01R 12/716 439/79 |
| 6,176,709 | B1 * | 1/2001 | Sonobe | H01R 12/57 439/69 |
| 6,200,146 | B1 * | 3/2001 | Sarkissian | H01R 13/035 439/79 |
| 8,616,901 | B2 * | 12/2013 | Shindo | H01R 12/724 439/540.1 |
| 2003/0013330 | A1 * | 1/2003 | Takeuchi | H01R 12/57 439/83 |
| 2004/0166705 | A1 * | 8/2004 | Koehler | H01R 12/724 439/79 |

FOREIGN PATENT DOCUMENTS

| | | |
|---|---|---|
| JP | 2011204451 A | 10/2011 |
| JP | 2014053144 A | 3/2014 |
| JP | 2014143059 A | 8/2014 |
| WO | 2008111517 A1 | 9/2008 |

OTHER PUBLICATIONS

International Search Report dated Jun. 30, 2015, issued by the International Searching Authority in counterpart International Application No. PCT/JP2015/062457 (PCT/ISA/210).

Written Opinion dated Jun. 30, 2015, issued by the International Searching Authority in counterpart International Application No. PCT/JP2015/062457 (PCT/ISA/237).

\* cited by examiner

RUNNING DIRECTION OF RAIL

CONNECTOR

CROSS REFERENCE TO RELATED APPLICATIONS

This application is a continuation of PCT application No. PCT/JP2015/062457, which was filed on Apr. 23, 2015 based on Japanese Patent Application (No. 2014-089982) filed on Apr. 24, 2014 and Japanese Patent Application (No. 2014-111833) filed on May 30, 2014, the contents of which are incorporated herein by reference.

BACKGROUND OF THE INVENTION

1. Field of the Invention

The present invention relates to a connector in which foot portions of terminals extending to the outside of a connector housing are soldered with a circuit board by a reflow system.

2. Description of the Related Art

As a connector to be mounted on a circuit board, there has been known a so-called insertion mounting type connector in which foot portions of a plurality of terminals extending to the outside of a connector housing are inserted into through holes provided in the circuit board, and the foot portions are soldered with lands provided at the circumferential edges of the openings of the through holes (see JP-A-2008-146880).

In the insertion mounting type connector configured thus, a position aligning plate in which insertion holes for the foot portions have been formed is disposed near the circuit board in order to avoid misalignment of the foot portions of the terminals with respect to the through holes. When the foot portions are inserted into the insertion holes of the position aligning plate, the foot portions can match with the through holes.

However, according to the technique of JP-A-2008-146880, when the foot portions of the terminals are soldered with the circuit board by a reflow system using hot air as a heating source, the hot air is blocked by the position aligning plate because the vicinity of the circuit board is covered with the position aligning plate. Thus, the hot air cannot reach soldering parts easily. As a result, soldering defect may be induced, or the temperature of the hot art in a heating furnace cannot be managed easily.

SUMMARY OF THE INVENTION

The present invention is to solve the foregoing problem. An object of the invention is to provide a connector capable of preventing soldering defect and capable of making it easy to manage the temperature of hot air in spite of a position aligning plate covering the vicinity of a circuit board when soldering is performed by a reflow system using the hot air as a hearing source.

Means for Solving the Problem

A connector according to the invention includes a connector housing, a plurality of terminals including foot portions extending to the outside of the connector housing, and a position aligning plate including a plurality of terminal insertion holes, the foot portions of the terminals configured to be inserted into the terminal insertion holes, the foot portions align with corresponding through holes of a circuit board. The foot portions of the terminals are configured to be soldered with the circuit board by a reflow system using hot air as a hearing source. Vent holes are provided in the position aligning plate to introduce the hot air to soldering parts through the vent holes.

According to the connector according to the invention, during a soldering step, a part of hot air blown against the position aligning plate is introduced into the soldering parts, in which the foot portions of the terminals of the connector have been inserted into the through holes of the circuit board, through the vent holes provided in the position aligning plate. As a result, the hot air can be sufficiently sent to the soldering parts, so that defect in soldering between each terminal of the connector and the circuit board by a reflow system can be prevented. In addition, even when the vicinity of the circuit board is covered with the position aligning plate, the hot air can be sufficiently introduced to the soldering parts through the vent holes as described above. Thus, it is not necessary to increase the heating temperature in consideration of the fear that the hot air may be blocked by the position aligning plate as in the background art, but it is possible to make it easy to manage the temperature of the hot air. Accordingly, even when the vicinity of the circuit board is covered with the position aligning plate, it is possible to prevent soldering defect in soldering by a reflow system using hot air as a heating source, and it is possible to make it easy to manage the temperature of the hot air.

In addition, in the connector according to the invention, it is preferable that each of the terminals extends in a direction substantially parallel with the circuit board and penetrates a side wall of the connector housing, and each of the foot portions is bent in a direction perpendicular to the circuit board.

According to this connector, the position aligning plate can be fixed closely to a lower side portion of the side wall of the connector housing so that the supporting rigidity of the position aligning plate can be enhanced.

In addition, in the connector according to the invention, it is preferable that the vent holes are provided in positions close to the terminal insertion holes of the position aligning plate.

According to this connector, hot air can be introduced along the foot portions of the terminals so that the hot air can be collected into a pinpoint in each soldering part. Thus, the heating efficiency can be enhanced.

In addition, in the connector according to the invention, it is preferable that each of the vent holes is provided to have a tapered surface widened toward the circuit board.

According to this connector, the spreading angle of the hot air blown out can be set suitably in consideration of a distance between the circuit board and the position aligning plate.

In addition, in order to solve the foregoing problem, the invention provides a connector including: a connector housing; terminals including foot portions extending to the outside of the connector housing; and a position aligning plate including terminal insertion holes, the foot portions of the terminals being configured to be inserted into the terminal insertion holes so that the foot portions align with through holes of a printed circuit board. The foot portions of the terminals are configured to be soldered with the printed circuit board by a reflow system using hot air as a hearing source. A vent hole is provided in the connector housing to blow out the hot air to soldering parts through the vent hole.

With this configuration, a part of hot air supplied in a heating furnace during a soldering step can be blown out to the soldering parts between the foot portions of the terminals and the printed circuit board through the vent hole of the connector housing without being blocked by the position aligning plate.

Thus, the hot air can be sufficiently sent to the soldering parts, so that soldering between the terminals of the connector and the printed circuit board can be performed suitably by a reflow system.

In addition, even when the printed circuit board is covered with the position aligning plate, the hot air can be sufficiently blown out to the soldering parts through the vent hole as described above. Accordingly, it is not necessary to increase the heating temperature wastefully in consideration of the fear that the hot air may be blocked by the position aligning plate, but it is possible to make it easy to manage the temperature of the hot air.

Here, according to the invention, it is preferable that the aforementioned connector housing is disposed laterally so that a side wall penetrated by the terminals is substantially perpendicular to the printed circuit board. Each of the foot portions of the terminals is provided to be bent in a direction intersecting the printed circuit board. In this case, it is desired that the vent hole is disposed in a corner region formed by the side wall penetrated by the terminals and a side wall of the connector housing close to the printed circuit board and located adjacently to the side wall penetrated by the terminals.

According to this configuration, the vent hole can be set the most closely to the soldering parts of the connector housing so that the heating efficiency in the soldering parts can be enhanced. In addition, the vent hole can be disposed in the corner region whose rigidity is high in the connector housing. Thus, the degree of freedom in design can be enhanced without lowering the rigidity of the connector housing. In addition thereto, the position aligning plate can be fixed closely to a lower side portion of the side wall of the connector housing so that the supporting rigidity of the position aligning plate can be enhanced. In addition, due to the connector housing disposed laterally, the connector can be prevented from being bulky, so that the circuit board can be made compact.

In addition, according to the invention, it is preferable that the aforementioned vent hole includes a blowing guide portion configured to guide the hot air blown off to the soldering part.

According to this configuration, the hot air can be collected into a pinpoint in each soldering part. Thus, the heating efficiency can be enhanced.

In addition, according to the invention, it is preferable that the blowing guide portion is configured to have a slope provided in an inner surface of the vent hole.

According to this configuration, diffusion of the hot air blown out through the vent hole is suppressed so that the hot air can be introduced and collected around each soldering part. Thus, the heating efficiency can be enhanced.

In addition, according to the invention, it is preferable that the vent hole is configured to blow out the hot air to a gap between the position aligning plate and the printed circuit board.

According to this configuration, a part of hot air supplied in a heating furnace during a soldering step can be blown out through the vent hole of the connector housing to the soldering parts covered with the position aligning plate.

Advantage of the Invention

According to the invention, even when the vicinity of a circuit board is covered with a position aligning plate, it is possible to prevent soldering defect in soldering by a reflow system using hot air as a heating source, and it is possible to make it easy to manage the temperature of the hot air.

DETAILED DESCRIPTION OF THE EXEMPLARY EMBODIMENTS

First Embodiment

A connector according to a first embodiment of the invention will be described below with reference to FIGS. 1 to 6.

Figure 1:
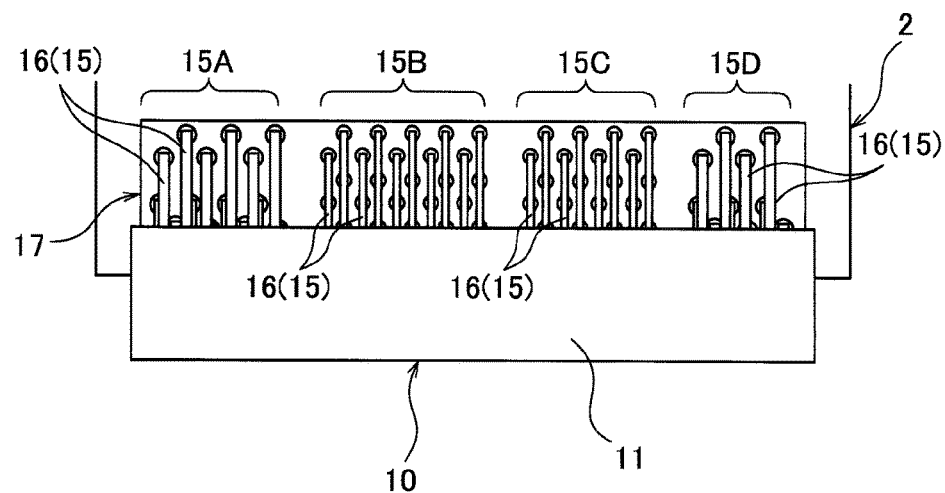
FIG. 1 is a plan view schematically showing a part in which a connector is disposed on a circuit board according to a first embodiment of the invention.
Figure 2:
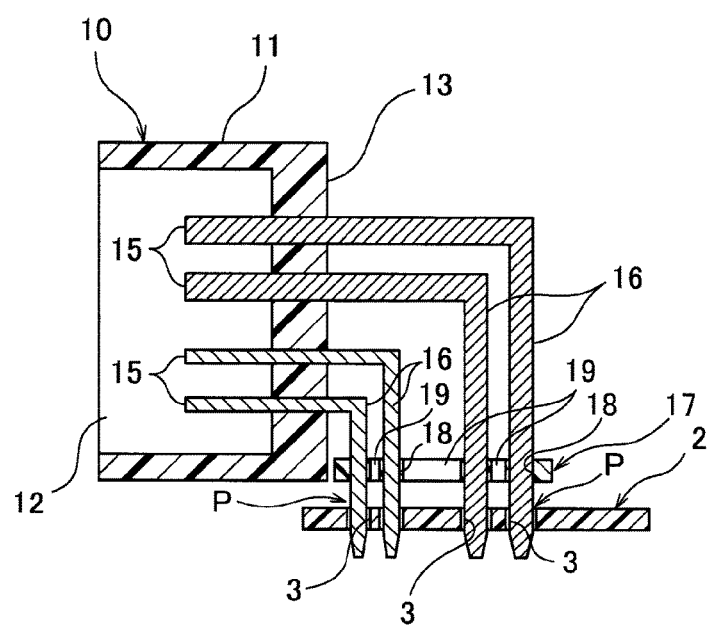
FIG. 2 is a sectional view showing a state in which the connector is mounted on the circuit board shown in FIG. 1.

FIG. 1 is a plan view schematically showing a part in which a connector is disposed on a circuit board according to a first embodiment of the invention. FIG. 1 shows the arrangement relationship between a circuit board 2 and a connector 10. In addition, FIG. 2 is a sectional view showing a state in which the connector is mounted on the circuit board shown in FIG. 1. As shown in FIG. 1 and FIG. 2, the connector 10 has a connector housing 11, and a plurality of terminals 15 provided in the connector housing 11.

The connector housing 11 is formed by molding out of an electrical insulating material such as synthetic resin. In the example shown in FIGS. 1 and 2, the connector housing 11 is formed into a rectangular box-like shape provided with an insertion port 12 on one side. A not-shown external connector is fitted and connected to the insertion port 12.

The terminals 15 are fixedly disposed to penetrate a side wall 13 of the connector housing 11 in the insertion direction of the external connector. The side wall 13 is opposed to the insertion port 12. A foot portion 16 extends with a required length from each terminal 15 to the outside of the connector housing 11.

In accordance with the specification of the circuit board 2, the terminals 15 are arranged as a plurality of terminal groups 15A to 15D as shown in FIG. 1. The insertion port 12 of the connector housing 11 is divided into a plurality of segments in accordance with the terminal groups 15A to 15D.

The connector 10 is arranged as a so-called insertion mounting type connector. That is, the foot portions 16 of the terminals 15 extending to the outside of the connector housing 11 are inserted into through holes 3 provided in the circuit board 2. In this state, the foot portions 16 are soldered with not-shown lands provided at the circumferential edges of the openings of the through holes 3.

In the insertion mounting type connector 10 configured thus, the foot portions 16 of the terminals 15 are matched with the through holes 3 of the circuit board 2 near the circuit board 2 by a position aligning plate 17 in order to prevent misalignment of the foot portions 16 to the through holes 3.

Figure 3:
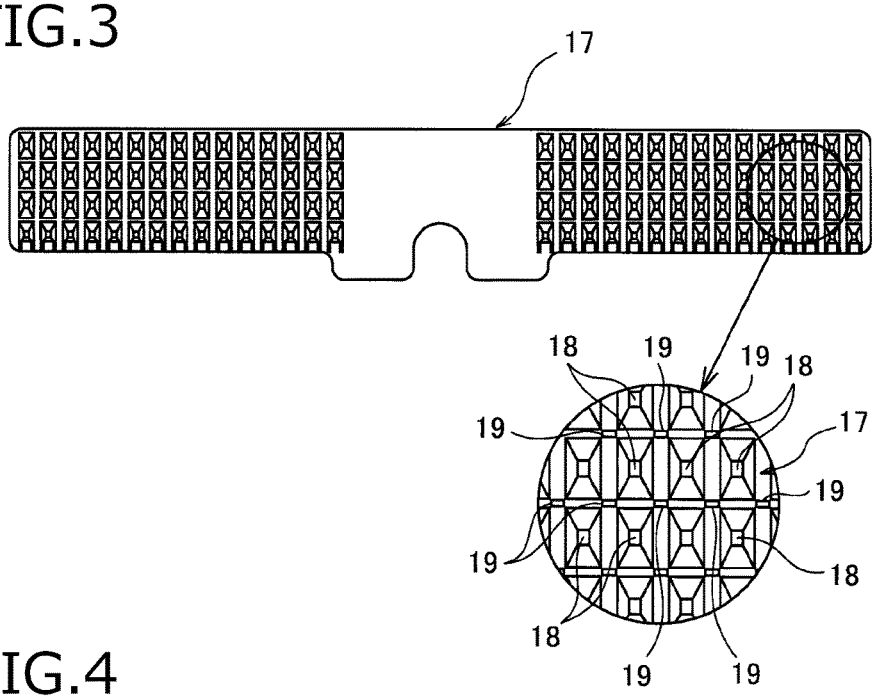
FIG. 3 is a plan view showing an example of a position aligning plate.

FIG. 3 is a plan view showing an example of the position aligning plate 17. The position aligning plate 17 shown in FIG. 3 is formed out of a suitable electrical insulating material such as synthetic resin. In the position aligning plate 17, a plurality of terminal insertion holes 18 are formed in a region of its plate surface including the terminal groups 15A to 15D.

The terminal insertion holes 18 are arranged like a grid and at a required pitch in accordance with the through holes 3 of the circuit board 2 and the foot portions 16 of the terminals 15 of the connector 10. That is, the terminal insertion holes 18 are formed at a required longitudinal pitch and a required lateral pitch. The terminal insertion holes 18 can support specifications different in the number of foot portions.

The position aligning plate 17 is fixedly attached to the connector housing 11. In some case, the foot portions 16 of the terminals 15 themselves may be formed as supports for the position aligning plate 17.

The front end parts of the foot portions 16 of the terminals 15 are inserted into the terminal insertion holes 18 of the position aligning plate 17. The protruding ends of the foot portions 16 are inserted into the through holes 3 of the circuit board 2. Thus, the connector 10 is temporarily assembled. In this state, the foot portions 16 are soldered with not-shown lands provided around the through holes 3, by a reflow system using hot air as a heating source. Thus, the connector 10 is mounted on the circuit board 2.

In the embodiment, each of the terminals 15 extends in a direction substantially parallel with the circuit board 2 and penetrates the side wall 13 of the connector housing 11. Each foot portion 16 is formed to be bent in a direction perpendicular to the circuit board 2.

Further, vent holes 19 are provided in the position aligning plate 17 so that hot air can be introduced to soldering parts P between the foot portions 16 and the lands around the through holes 3 during the aforementioned soldering step.

It is preferable that the vent holes 19 are provided in positions close to the terminal insertion holes 18 in the position aligning plate 17. For example, it is more preferable that each vent hole 19 is formed in a partition intersecting portion between adjacent ones of the terminal insertion holes 18 arranged like a grid, as shown in the enlarged portion of FIG. 3 by way of example.

Figure 4:
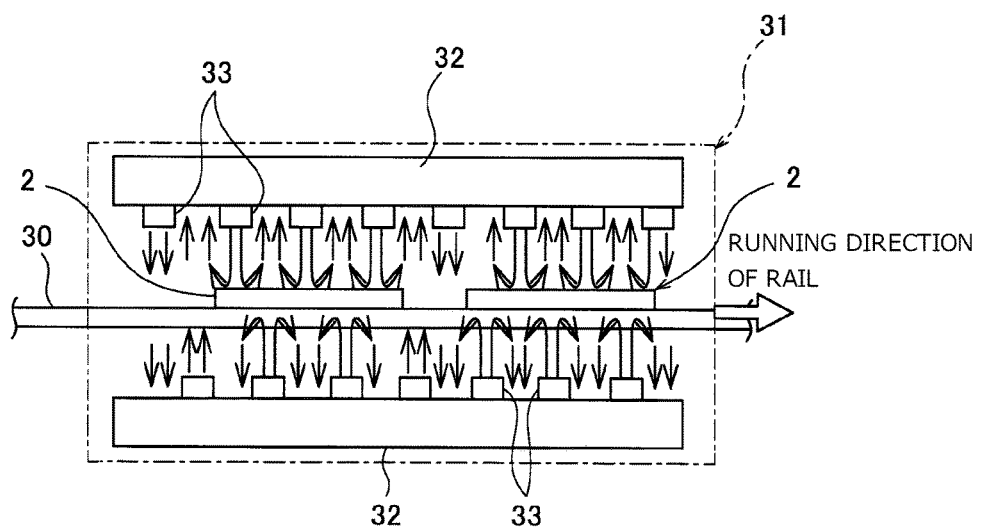
FIG. 4 is a view showing a soldering step using a reflow system.

Next, a method for soldering the connector 10 according to the embodiment will be described. FIG. 4 is a view showing a soldering step using a reflow system. Circuit boards 2 in which connectors 10 have been temporarily assembled are sequentially transported into a heating furnace 31 by a conveyance rail 30.

In the heating furnace 31, heating air ducts 32 are disposed to face each other above and under the conveyance rail 30 so as to put the conveyance rail 30 therebetween. Hot air heated to a required temperature is blown out from a plurality of nozzles 33 provided in the heating air ducts 32 as shown by the arrows. Due to the hot air, the soldering parts P in which the foot portions 16 of the terminals 15 of the connector 10 have been inserted into the through holes 3 of the circuit board 2 are heated to a melting temperature of solder provided on the circuit board 2 side in advance. Thus, soldering is carried out.

Figure 5:
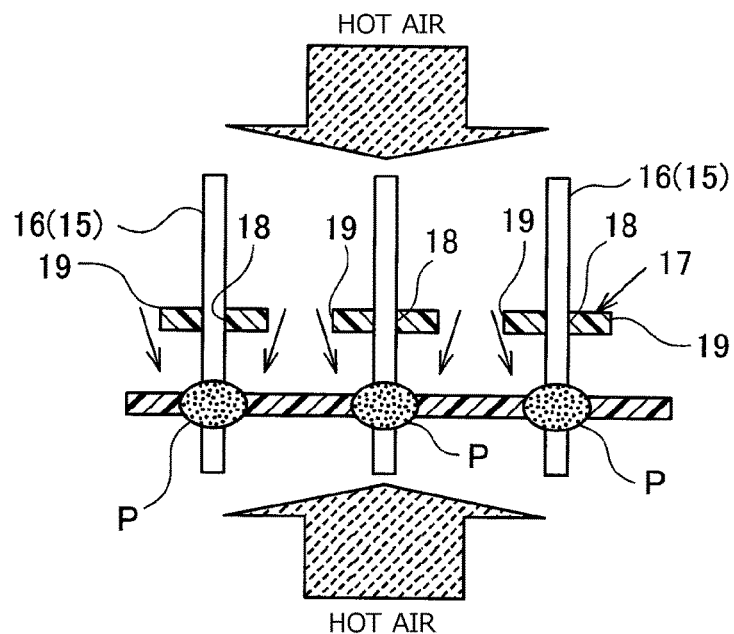
FIG. 5 is a schematic sectional view showing a first introduction form of hot air.

Next, the operation of the connector 10 according to the invention will be described. FIG. 5 is a schematic sectional view showing a first introduction form of hot air. In a background-art insertion mounting type connector, the vicinity of a circuit board is covered with a position aligning plate disposed in foot portions of terminals. Therefore, hot air cannot reach soldering parts easily.

However, according to the embodiment, a part of hot air blown against the position aligning plate 17 in the heating furnace 31 can be introduced to the soldering parts P through the vent holes 19 provided in the position aligning plate 17 as shown in FIG. 5.

As a result, the hot air can be sufficiently sent to the soldering parts P. Thus, soldering can be carried out properly between each terminal 15 of the connector 10 and the circuit board 2 by a reflow system.

In addition, even when the vicinity of the circuit board 2 is covered with the position aligning plate 17, hot air can be sufficiently introduced to the soldering parts P by the vent holes 19 as described above. Accordingly, it is not necessary to increase the heating temperature in consideration of the fear that the hot air may be blocked by the position aligning plate 17 as in the background art, but it is possible to manage the temperature of the hot air easily.

Figure 6:
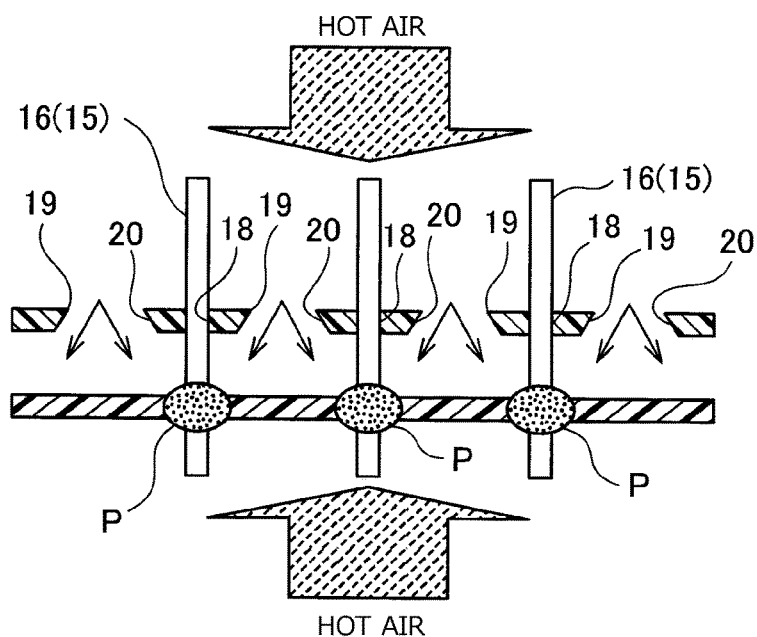
FIG. 6 is a schematic sectional view showing a second introduction form of hot air.

FIG. 6 is a schematic sectional view showing a second introduction form of hot air. As shown in FIG. 6, it is desired that each vent hole 19 is formed with a tapered surface 20 widened toward the circuit board 2. As a result, hot air can be introduced with a spread in and around each soldering part P. Thus, the heating efficiency can be enhanced. Incidentally, the tapered surface 20 is set suitably in consideration of a distance between the circuit board 2 and the position aligning plate 17.

In this manner, according to the connector 10 according to the invention, a part of hot air blown against the position aligning plate 17 during the soldering step can be introduced to the soldering parts P in which the foot portions 16 of the terminals 15 of the connector 10 have been inserted into the through holes 3 of the circuit board 2, through the vent holes 19 provided in the position aligning plate 17. As a result, the hot air can be sufficiently sent to the soldering parts P, so that defect in soldering between each terminal 15 of the connector 10 and the circuit board 2 by a reflow system can be prevented. In addition, even when the terminals 15 are covered with the position aligning plate 17 near the circuit board 2, hot air can be sufficiently introduced to the soldering parts P through the vent holes 19 as described above. Accordingly, it is not necessary to increase the heating temperature in consideration of the fear that the hot air may be blocked by the position aligning plate 17 as in the background art, but it is possible to manage the temperature of the hot air easily. Accordingly, even when the vicinity of the circuit board 2 is covered with the position aligning plate 17, it is possible to prevent soldering defect in soldering by a reflow system using hot air as a heating source, and it is possible to make it easy to manage the temperature of the hot air.

In addition, each terminal 15 extends in a direction substantially parallel with the circuit board 2 and penetrates the side wall 13 of the connector housing 11, and each foot portion 16 is bent in a direction perpendicular to the circuit board 2. Accordingly, the position aligning plate 17 can be fixed closely to a lower side portion of the side wall 13 of the connector housing 11. Thus, the supporting rigidity of the position aligning plate 17 can be enhanced.

In addition, the vent holes 19 are formed in positions close to the terminal insertion holes 18. Accordingly, hot air can be introduced along the foot portions 16 of the terminals 15 so that the hot air can be collected into a pinpoint in each soldering part P. Thus, the heating efficiency can be enhanced.

Further, each vent hole 19 is formed to have a tapered surface 20 widened toward the circuit board 2. Accordingly, the spreading angle of the hot air blown out can be set suitably in consideration of the distance between the circuit board 2 and the position aligning plate 17.

The invention has been described above based on its embodiment. However, the invention is not limited to the embodiment. Changes may be made without departing from the gist of the invention.

For example, in the aforementioned embodiment, the connector housing 11 is disposed laterally to set the insertion direction of an external connector substantially in parallel with the circuit board 2. The invention is not limited thereto, but it may be applied to a structure in which the connector housing 11 is disposed vertically to set the insertion port 12 of the connector housing 11 upward relatively to the circuit board 2.

Second Embodiment

A connector according to a second embodiment of the invention will be described below with reference to FIGS. 7 to 12. Incidentally, constituent members fundamentally the same as those in the aforementioned first embodiment will be referenced correspondingly, and detailed description thereof will be omitted.

Figure 7:
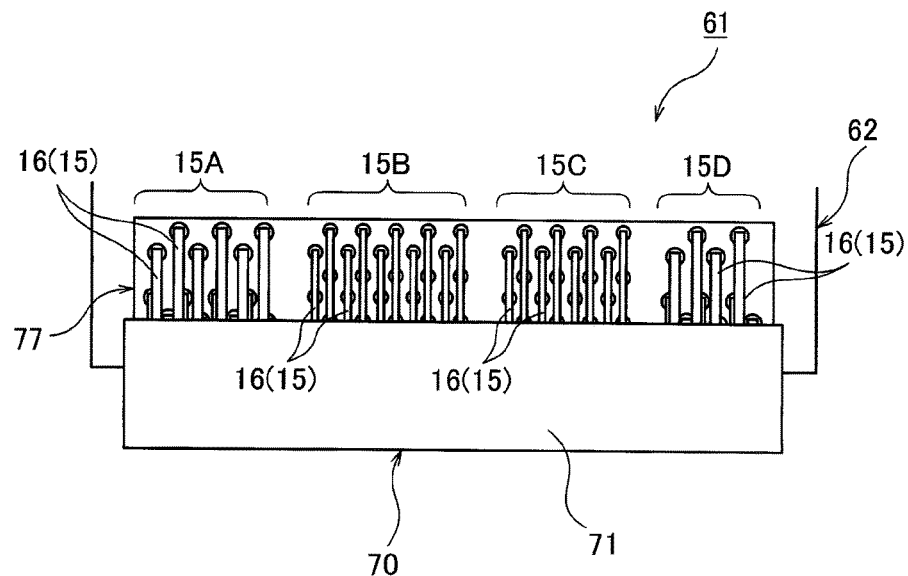
FIG. 7 is an explanatory plan view schematically showing a part in which a connector is disposed on a printed circuit board according to a second embodiment of the invention.
Figure 8:
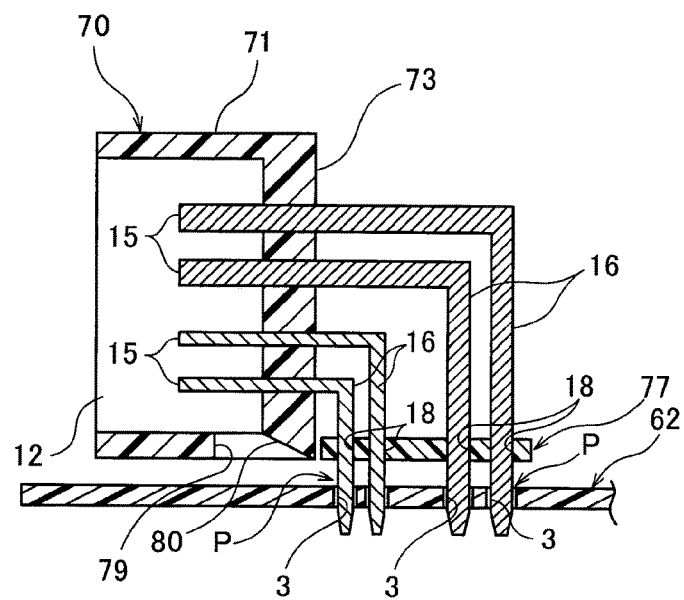
FIG. 8 is an explanatory sectional view showing a state in which the connector is mounted on the printed circuit board shown in FIG. 7.

FIG. 7 is a plan view showing the arrangement relationship between a printed circuit board 62 and a connector 70 in a circuit board 61 according to the second embodiment.

The connector 70 has a connector housing 71, and a plurality of terminals 15 provided in the connector housing 71.

The connector housing 71 is formed by molding out of a suitable electrical insulating material such as synthetic resin. In the example shown in FIGS. 7 and 8, the connector housing 71 is formed into a rectangular box-like shape provided with insertion ports 12 on one side. A not-shown external connector is fitted and connected to each insertion port 12.

The terminals 15 are fixedly disposed to penetrate an end wall (side wall) 73 of the connector housing 71 in the insertion direction of the external connector. The end wall 73 is opposed to each insertion port 12. A foot portion (lead) 16 extends with a required length from each terminal 15 to the outside of the connector housing 71.

In accordance with the specification of the circuit board 61, the terminals 15 are arranged as a plurality of terminal groups 15A to 15D as shown in FIG. 7. A plurality of insertion ports 12 of the connector housing 71 are formed in accordance with the terminal groups 15A to 15D.

The connector 70 is arranged as a so-called insertion mounting type connector. That is, the foot portions 16 of the terminals 15 are inserted into through holes 3 provided in a printed circuit board 62. In this state, the foot portions 16 are soldered with not-shown lands provided at the circumferential edges of the openings of the through holes 3.

In the insertion mounting type connector 70 configured thus, the foot portions 16 of the terminals 15 are matched with the through holes 3 of the printed circuit board 62 near the printed circuit board 62 by a position aligning plate 77 in order to prevent misalignment of the foot portions 16 to the through holes 3.

Figure 9:
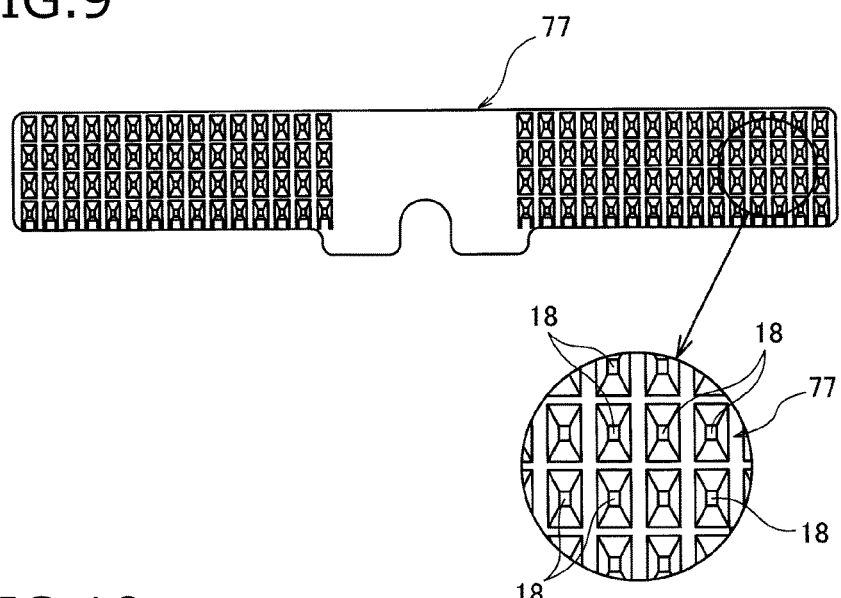
FIG. 9 is an explanatory plan view showing an example of a position aligning plate.

FIG. 9 shows an example of the position aligning plate 77. The position aligning plate 77 is formed out of a suitable electrical insulating material such as synthetic resin. In the position aligning plate 77, a plurality of terminal insertion holes 18 are formed in a region of its plate surface including the terminal groups 15A to 15D.

The terminal insertion holes 18 are arranged like a grid and at a required pitch in accordance with the through holes 3 of the printed circuit board 62 and the foot portions 16 of the terminals 15 of the connector 70. That is, the terminal insertion holes 18 are formed orderly at a required longitudinal pitch and a required lateral pitch. The terminal insertion holes 18 can support specifications different in the number of foot portions.

The position aligning plate 77 is fixedly attached to the connector housing 71. In some case, the foot portions 16 of the terminals 15 themselves may be formed as supports for the position aligning plate 77.

The front end parts of the foot portions 16 of the terminals 15 are inserted into the terminal insertion holes 18 of the position aligning plate 77. The protruding ends of the foot portions 16 are matched with the through holes 3 of the printed circuit board 62 and inserted into the through holes 3. Thus, the connector 70 is temporarily assembled. In this state, the foot portions 16 are soldered with not-shown lands provided around the through holes 3, by a reflow system using hot air as a heating source. Thus, the connector 70 is mounted on the printed circuit board 62.

In the embodiment, the connector housing 71 is placed laterally so that the end wall 73 penetrated by the terminals 15 disposed therein can be made substantially perpendicular to the printed circuit board 62. Thus, the connector housing 71 id disposed in parallel with the printed circuit board 62 and closely thereto. In addition, each of the foot portions 16 of the terminals 15 is formed to be bent in a direction intersecting (perpendicular to) the printed circuit board 62.

In this manner, bulkiness of the connector 70 is made as low as possible in order to make the circuit board 61 compact.

In the connector housing 71, a vent hole 79 is provided to be open near the soldering parts P in which the foot portions 16 of the terminals 15 have been inserted into the through holes 3 of the printed circuit board 62 so that hot air for heating can be blown out to the soldering parts P during the aforementioned soldering step. To say other words, the vent hole 79 is formed so that hot air can be blown out to a gap between the position aligning plate 77 and the printed circuit board 62.

Figure 10:
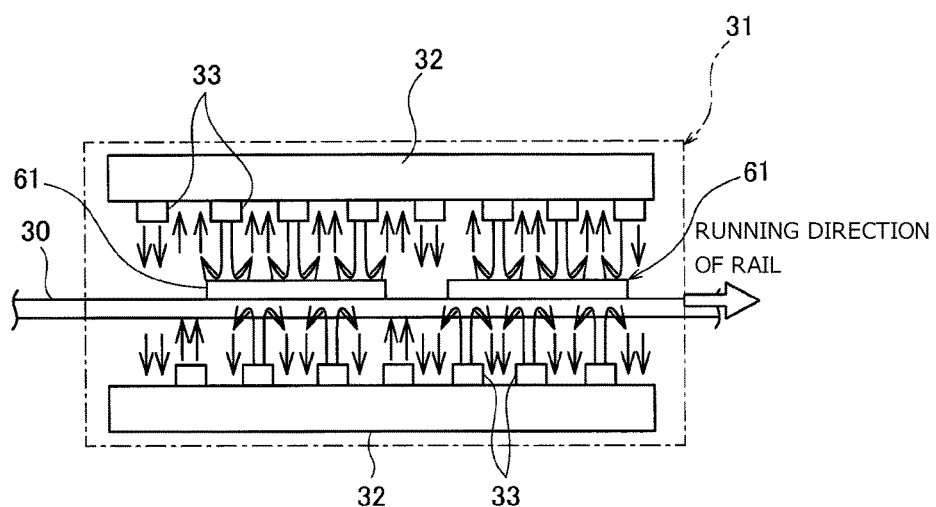
FIG. 10 is an explanatory view showing a soldering step using a reflow system.
Figure 11:
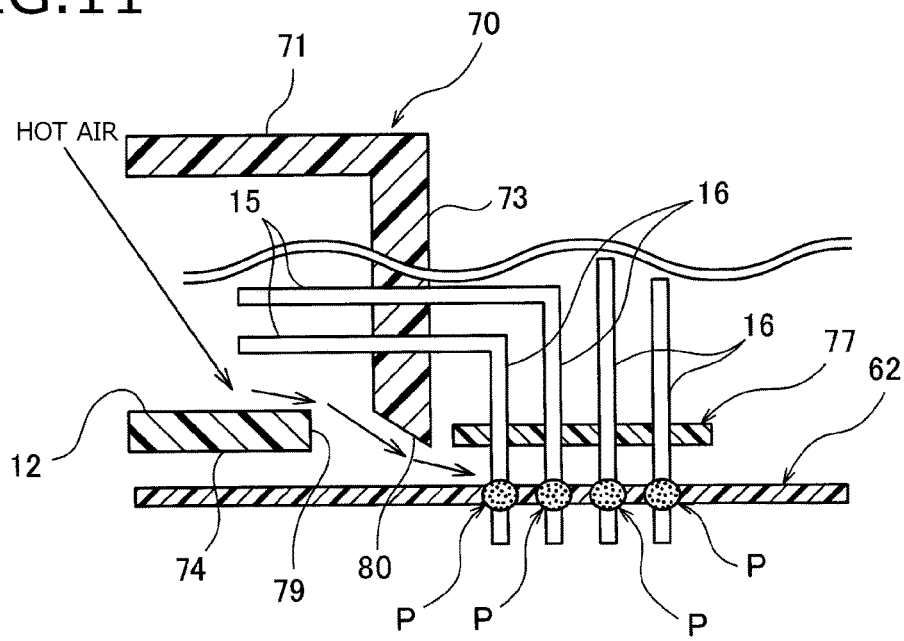
FIG. 11 is an explanatory sectional view schematically showing an introduction form of hot air.

FIG. 10 shows a step of soldering the circuit board 61 in which the connector 70 has been temporarily assembled on the printed circuit board 62 as described above, by use of a reflow system.

In a mounting/assembling line for circuit boards 61, the circuit boards 61 in each of which the printed circuit board 62 and the connector 70 have been temporarily assembled as described above are transported sequentially to a heating furnace 31 by a conveyance rail 30 so that the insertion ports 12 of each connector housing 71 for connection with external connectors can face the traveling direction.

In the heating furnace 31, heating air ducts 32 are disposed to face each other above and under the conveyance rail 30 so as to put the conveyance rail 30 therebetween. Hot air heated to a required temperature is blown out from a plurality of nozzles 33 provided in the heating air ducts 32 as shown by the arrows. Due to the hot air, the soldering parts P in which the foot portions 16 of the terminals 15 have been inserted into the through holes 3 of the printed circuit board 62 are heated to a melting temperature of solder provided on the printed circuit board 62 side in advance. Thus, soldering is carried out between the foot portions 16 and not-shown lands around the through holes 3.

Here, in a background-art insertion mounting type connector, a printed circuit board is covered with a position aligning plate disposed in foot portions of terminals. Therefore, hot air cannot reach soldering parts easily.

On the other hand, according to the embodiment, a part of hot air supplied in the heating furnace 31 during the soldering step is passed through the inside of the housing from the insertion ports 12 of the connector housing 71, and blown out from the vent hole 79 of the connector housing 71. Thus, the hot air can reach the soldering parts P covered with the position aligning plate 77.

Specifically, when the circuit board 61 is conveyed into the heating furnace 31 by the conveyance rail 30 as described above, a part of hot air blown out from the nozzles 33 of the heating air ducts 32 serves as pushing air flowing obliquely into the insertion ports 12 of the connector housing 71 due to the insertion ports 12 facing the traveling direction. Then, the hot air passing through the inside of the connector housing 71 is blown out to a gap between the position aligning plate and the printed circuit board from the vent hole 79 as described above. Thus, the hot air can be blown against the soldering parts P (see FIG. 11).

As a result, the hot air can be sufficiently sent to the soldering parts P. Thus, soldering can be carried out properly between each terminal 15 of the connector 70 and the printed circuit board 62 by a reflow system.

In addition, even when the printed circuit board 62 is covered with the position aligning plate 77, hot air can be sufficiently introduced to the soldering parts P by the vent hole 79 as described above. Accordingly, it is not necessary to increase the heating temperature wastefully in consideration of the fear that the hot air may be blocked by the position aligning plate 77, but it is possible to manage the temperature of the hot air easily.

Here, the aforementioned connector housing 71 is disposed laterally so that the end wall 73 penetrated by the terminals 15 can be made substantially perpendicular to the printed circuit board 62, and each of the foot portions 16 of the terminals 15 is formed to be bent in a direction intersecting the printed circuit board 62. The vent hole 79 of the connector housing 71 is disposed in a corner region formed by the end wall 73 penetrated by the foot portions 16 of the terminals 15 and a side wall 74 on the bottom portion side located adjacently to the end wall 73.

Thus, the vent hole 79 can be set the most closely to the soldering parts P of the connector housing 71 so that the heating efficiency in the soldering parts P can be enhanced. In addition, the vent hole 79 is disposed in the corner region whose rigidity is high in the connector housing 71. Thus, the degree of freedom in design can be enhanced without lowering the rigidity of the connector housing 71. In addition thereto, the position aligning plate 77 can be fixed closely to a lower side portion of the end wall 73 of the connector housing 71 so that the supporting rigidity of the position aligning plate 77 can be enhanced. In addition, due to the connector housing 71 disposed laterally, the connector 70 can be prevented from being bulky, so that the circuit board 61 can be made compact.

On the other hand, the vent hole 79 of the connector housing 71 has a blowing guide portion 80 by which the hot air blown off can be guided to the soldering parts P.

Thus, the hot air can be collected into a pinpoint in each soldering part P so that the heating efficiency can be enhanced The aforementioned blowing guide portion 80 can be, for example, formed as a downward slope in an inner surface of the vent hole 79 on the end wall 73 side.

According to this configuration, diffusion of the hot air blown out through the vent hole 79 is suppressed so that the hot air can be introduced and collected around each soldering part P. Thus, the heating efficiency can be enhanced.

Figure 12A:
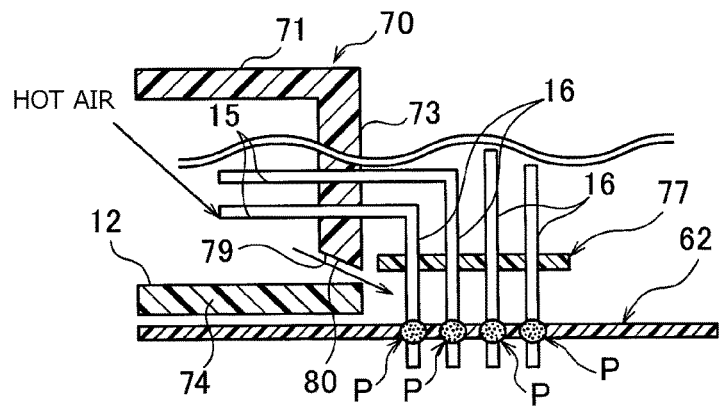
FIG. 12A and FIG. 12B are explanatory sectional views schematically showing examples of introduction forms of hot air respectively.
Figure 12B:
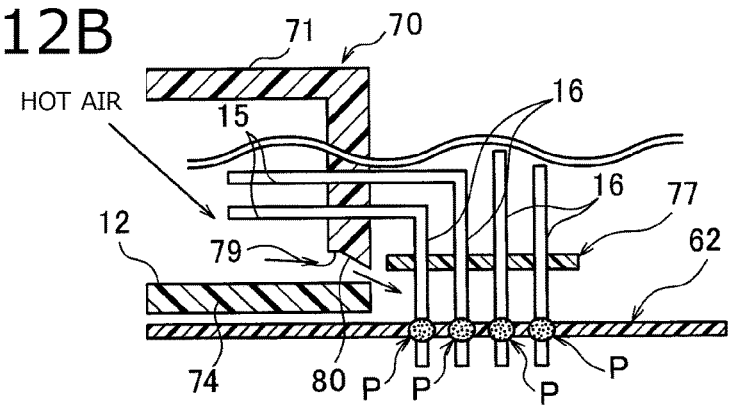

FIG. 12A and FIG. 12B show different examples of introduction forms of hot air by the vent hole 79. In any case of FIGS. 12A and (B), the vent hole 79 is provided in a lower end position of the end wall 73 continuously connected to the side wall 74 on the bottom portion side. In the example shown in FIG. 12A, of the vent hole 79, the upper inner surface as a whole is formed as a downward slope to form the blowing guide portion 80. In the example shown in FIG. 12B, the vent hole 79 is formed as a downward slope from the halfway of the upper inner surface to form the blowing guide portion 80.

Incidentally, although the embodiment shows a structure in which the connector housing 71 is disposed laterally by way of example, the invention can be applied to a structure in which the connector housing 71 is disposed vertically so that the insertion ports 12 can be set upward relatively to the printed circuit board 62.

Here, the features of the aforementioned embodiments of the connector according to the invention will be summarized and listed in the following paragraphs [1] to [9] respectively.

[1] A connector (10) including:
a connector housing (11);
a plurality of terminals (15) including foot portions (16) extending to the outside of the connector housing; and
a position aligning plate (17) including a plurality of terminal insertion holes (18), the foot portions of the terminals being configured to be inserted into the terminal insertion holes so that the foot portions align with corresponding through holes (3) of a circuit board,
wherein the foot portions of the terminals are configured to be soldered with the circuit board by a reflow system using hot air as a hearing source; and
wherein a vent hole (19) is provided in the position aligning plate to introduce the hot air to soldering parts through the vent hole.

[2] The connector according to the aforementioned paragraph [1], wherein each of the terminals extends in a direction substantially parallel with the circuit board and penetrates a side wall of the connector housing, and each of the foot portions is bent in a direction perpendicular to the circuit board.

[3] The connector according to the aforementioned paragraph [1] or [2], wherein the vent hole is provided in positions close to the terminal insertion holes of the position aligning plate.

[4] The connector according to any one of the aforementioned paragraphs [1] through [3], wherein the vent hole is provided to have a tapered surface (20) widened toward the circuit board.

[5] A connector (70) including:
a connector housing (71);
terminals (15) including foot portions (16) extending to the outside of the connector housing; and
a position aligning plate (77) including terminal insertion holes (18), the foot portions of the terminals being configured to be inserted into the terminal insertion holes so that the foot portions align with through holes (3) of a printed circuit board,
wherein the foot portions of the terminals are configured to be soldered with the printed circuit board by a reflow system using hot air as a hearing source; and
wherein a vent hole (79) is provided in the connector housing to blow out the hot air to a soldering part through the vent hole.

[6] The connector according to the paragraph [5], wherein the connector housing is disposed laterally so that a side wall penetrated by the terminals is substantially perpendicular to the printed circuit board;
wherein each of the foot portions of the terminals is provided to be bent in a direction intersecting the printed circuit board; and
wherein the vent hole is disposed in a corner region formed by the side wall penetrated by the terminals and a side wall of the connector housing close to the printed circuit board and located adjacently to the side wall penetrated by the terminals.

[7] The connector according to the paragraph [5] or [6], wherein the vent hole includes a blowing guide portion configured to guide the hot air blown off to the soldering part.

[8] The connector according to the paragraph [7], wherein the blowing guide portion is configured to have a slope provided in an inner surface of the vent hole.

[9] The connector according to any one of the paragraphs [5] to [8], wherein the vent hole is configured to blow out the hot air to a gap between the position aligning plate and the printed circuit board.

The invention has been described in detail and with reference to its specific embodiments. However, it is obvious for those skilled in the art that various changes or modifications can be made on the invention without departing from the spirit and scope thereof.

According to the invention, there is an effect that, even when the vicinity of a circuit board is covered with a position aligning plate, it is possible to prevent soldering defect in soldering by a reflow system using hot air as a heating source, and it is possible to make it easy to manage the temperature of the hot air. The invention having the effect is useful for a connector in which foot portions of terminals extending to the outside of a connector housing are soldered with a circuit board by a reflow system.

What is claimed is:

1. A connector comprising:
a connector housing;
a plurality of terminals including foot portions extending to the outside of the connector housing; and
a position aligning plate including a plurality of terminal insertion holes, the foot portions of the terminals being configured to be inserted into the terminal insertion holes so that the foot portions align with corresponding through holes of a circuit board,
wherein the foot portions of the terminals are configured to be soldered with the circuit board by a reflow system using hot air as a hearing source; and
wherein a vent hole is provided in the position aligning plate to introduce the hot air to soldering parts through the vent hole, wherein the vent hole is provided with a tapered surface widened from an end opposite the circuit board to an end toward the circuit board.

2. The connector according to claim 1, wherein each of the terminals extends in a direction substantially parallel with the circuit board and penetrates a side wall of the connector housing, and each of the foot portions is bent in a direction perpendicular to the circuit board.

3. The connector according to claim 1, wherein the vent hole is provided in a position close to the terminal insertion holes of the position aligning plate.

4. A connector comprising: a connector housing; terminals including foot portions extending to the outside of the connector housing; and a position aligning plate including terminal insertion holes, the foot portions of the terminals being configured to be inserted into the terminal insertion holes so that the foot portions aligns with through holes of a circuit hoard, wherein the foot portions of the terminals are configured to be soldered with the circuit hoard by a reflow system using hot air as a hearing source; and wherein a vent hole is provided in the connector housing to blow out the hot air to a soldering part through the vent hole; and wherein the vent hole is provided with a tapered surface widened from an end opposite the circuit board to an end toward the circuit board.

5. The connector according to claim 4, wherein the connector housing is disposed laterally so that a side wall penetrated by the terminals is substantially perpendicular to the circuit board; wherein each of the foot portions of the terminals is provided to be bent in a direction intersecting the circuit board; and wherein the vent hole is disposed in a corner region formed by the side wall penetrated by the terminals and a side wall of the connector housing close to the circuit board and located adjacently to the side wall penetrated by the terminals.

6. The connector according to claim 4, wherein the vent hole includes a blowing guide portion configured to guide the hot air blown off to the soldering part.

7. The connector according to claim 6, wherein the blowing guide portion is configured to have a slope provided in an inner surface of the vent hole.

8. The connector according to claim 4, wherein the vent hole is configured to blow out the hot air to a gap between the position aligning plate and the circuit board.

* * * * *